(12) United States Patent
Ma

(10) Patent No.: US 9,818,810 B2
(45) Date of Patent: Nov. 14, 2017

(54) OLED AND FABRICATION METHOD THEREOF, AND DISPLAY APPARATUS

(71) Applicant: BOE TECHNOLOGY GROUP CO., LTD., Beijing (CN)

(72) Inventor: Wenyu Ma, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/436,550

(22) PCT Filed: Sep. 18, 2014

(86) PCT No.: PCT/CN2014/086793
§ 371 (c)(1),
(2) Date: Apr. 17, 2015

(87) PCT Pub. No.: WO2015/169022
PCT Pub. Date: Nov. 12, 2015

(65) Prior Publication Data
US 2016/0141343 A1    May 19, 2016

(30) Foreign Application Priority Data
May 8, 2014 (CN) .......................... 2014 1 0191903

(51) Int. Cl.
*H01L 27/32* (2006.01)
*H01L 51/52* (2006.01)
*H01L 51/56* (2006.01)

(52) U.S. Cl.
CPC ...... *H01L 27/3248* (2013.01); *H01L 51/5253* (2013.01); *H01L 51/5275* (2013.01);
(Continued)

(58) Field of Classification Search
USPC .......................................................... 257/40
See application file for complete search history.

(56) References Cited

U.S. PATENT DOCUMENTS

2001/0033135 A1* 10/2001 Duggal ................. B82Y 20/00
                                                        313/506
2012/0217863 A1   8/2012 Hamatani et al.
(Continued)

FOREIGN PATENT DOCUMENTS

| CN | 1551693 A    | 12/2004 |
|----|--------------|---------|
| CN | 101853877 A  | 10/2010 |

(Continued)

OTHER PUBLICATIONS

Novaled, OLED Materials, May 27, 2011, p. 5.*
(Continued)

*Primary Examiner* — Marcos D Pizarro
*Assistant Examiner* — Lawrence Tynes, Jr.
(74) *Attorney, Agent, or Firm* — Banner & Witcoff, Ltd.

(57) ABSTRACT

An OLED and a fabrication method thereof, and a display apparatus are provided. The OLED comprises: a base substrate; a first electrode, an organic functional layer and a transparent or semi-transparent second electrode sequentially disposed on the base substrate; and a covering layer provided on a side of the second electrode away from the base substrate. A surface of the covering layer away from the base substrate is uneven.

11 Claims, 2 Drawing Sheets

(52) U.S. Cl.
CPC .......... *H01L 51/56* (2013.01); *H01L 27/3244* (2013.01); *H01L 2227/323* (2013.01)

(56) References Cited

U.S. PATENT DOCUMENTS

2012/0256201 A1\* 10/2012 Lee .................... H01L 51/5268
257/88
2015/0102294 A1\* 4/2015 Choi .................. H01L 51/5203
257/40

FOREIGN PATENT DOCUMENTS

| CN | 102573165 A | 7/2012 |
|---|---|---|
| CN | 102804916 A | 11/2012 |
| CN | 103972415 A | 8/2014 |
| CN | 203812920 U | 9/2014 |

OTHER PUBLICATIONS

Novaled AG, OLED Materials for Display and Lighting Application, www.novaled.com.\*
Jul. 31, 2015—(CN) Notice of Allowance Application 201410191903.2 with Eng Tran.
Apr. 9, 2015—(CN) Second Office Action Application 201410191903.2 with Eng Tran.
Feb. 6, 2015—(CN) International Search Report for PCT/CN2014/086793 and Eng Tran of Written Opinion.
Jan. 15, 2015—(CN) First Office Action Application 201410191903.2 with Eng Tran.

\* cited by examiner

OLED AND FABRICATION METHOD THEREOF, AND DISPLAY APPARATUS

The application is a U.S. National Phase Entry of International Application No. PCT/CN2014/086793 filed on Sep. 18, 2014, designating the United States of America and claiming priority to Chinese Patent Application No. 201410191903.2 filed on May 8, 2014. The present application claims priority to and the benefit of the above-identified applications and the above-identified applications are incorporated by reference herein in their entirety.

TECHNICAL FIELD

Embodiments of the disclosure relate to an OLED (Organic Light Emitting Diode) and a fabrication method thereof, and a display apparatus.

BACKGROUND

Organic Light Emitting Diode (OLED) is an organic thin film electroluminescence device and has advantages such as a simple fabrication process, a low cost, a wide viewing angle, suitable for a flexible structure and the like. Therefore, the display technology using the OLED has become an important display technology.

Currently, a light output efficiency of the OLED is relatively low; and in general, only a small amount of light emits to the air through a glass substrate. The main reasons for the low light output efficiency is as follows. A refractive index of an organic layer is higher than that of glass and air and a refractive index of the glass is higher than that of the air, a total reflection phenomenon will occur when light is emitted from a light-emitting layer formed of the organic layer to the glass and the air, i.e., light is enclosed between the organic layer and the glass substrate due to a waveguide phenomenon between the organic layer and the glass substrate and cannot be emitted to the air, and the enclosed light is referred to as a waveguide-mode light.

SUMMARY

According to embodiments of the present disclosure, there is provided an OLED, and the OLED comprises: a base substrate; a first electrode, an organic functional layer and a transparent or semi-transparent second electrode sequentially disposed on the base substrate; and a covering layer provided on a side of the second electrode away from the base substrate. A surface of the covering layer away from the base substrate is uneven.

For example, the covering layer comprises a polycrystalline organic layer.

For example, the covering layer comprises a first small-molecular organic layer and the polycrystalline organic layer provided on the first small-molecular organic layer; and a refractive index difference between the first small-molecular organic layer and the polycrystalline organic layer is less than 0.1.

For example, the covering layer comprises a second small-molecular organic layer and a third small-molecular organic layer provided on the second small-molecular organic layer and having an uneven upper surface, a refractive index difference between the second small-molecular organic layer and the third small-molecular organic layer is less than 0.1; and the uneven upper surface of the third small-molecular organic layer is obtained by crystallizing a third small-molecular organic material for forming the third small-molecular organic layer, and a glass transition temperature of a second small-molecular organic material for forming the second small-molecular organic layer is greater than a glass transition temperature of the third small-molecular organic material for forming the third small-molecular organic layer.

For example, the first electrode comprises an opaque metal layer, and the second electrode comprises a semi-transparent metal layer.

According to embodiments of the present disclosure, there is provided a display apparatus, and the display apparatus comprises the OLED as described above.

For example, the display apparatus further comprises a thin film transistor disposed between the base substrate and the first electrode of the OLED.

For example, the first electrode of the OLED is electrically connected with a drain electrode of the thin film transistor.

According to embodiments of the present disclosure, there is provided a fabrication method of an OLED. The method comprises: sequentially forming a first electrode, an organic functional layer, a transparent or semi-transparent second electrode on a base substrate, and forming a covering layer provided on a side of the second electrode away from the base substrate. A surface of the covering layer away from the base substrate is uneven.

For example, the forming the covering layer comprises: forming a polycrystalline organic layer on the base substrate provided with the second electrode.

For example, the forming the covering layer comprises: sequentially forming a first small-molecular organic layer and the polycrystalline organic layer on the base substrate provided with the second electrode, and a refractive index difference between the first small-molecular organic layer and the polycrystalline organic layer is less than 0.1.

For example, the forming the covering layer comprises: sequentially forming a second small-molecular organic layer and a third small-molecular organic layer on the base substrate provided with the second electrode; wherein a glass transition temperature of a second small-molecular organic material for forming the second small-molecular organic layer is greater than a glass transition temperature of a third small-molecular organic material for forming the third small-molecular organic layer; packaging the OLED; and heating the third small-molecular organic layer after packaging with a temperature slightly higher than the glass transition temperature of the third small-molecular organic material, so as to crystallize the third small-molecular organic material for forming the third small-molecular organic layer.

For example, the glass transition temperature of the second small-molecular organic material is greater than 120° C. ; and the glass transition temperature of the third small-molecular organic material is 60~100° C.

For example, the first electrode comprises an opaque metal layer, and the second electrode comprises a semi-transparent metal layer.

BRIEF DESCRIPTION OF THE DRAWINGS

In order to clearly illustrate the technical solution of the embodiments of the disclosure or of the prior art, the drawings of the embodiments or the prior art will be briefly described in the following; it is obvious that the described drawings are only related to some embodiments of the disclosure, and for those ordinarily skilled in the art, other drawings can further be obtained based on these drawings without inventive effort.

DESCRIPTION OF THE EMBODIMENTS

The technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
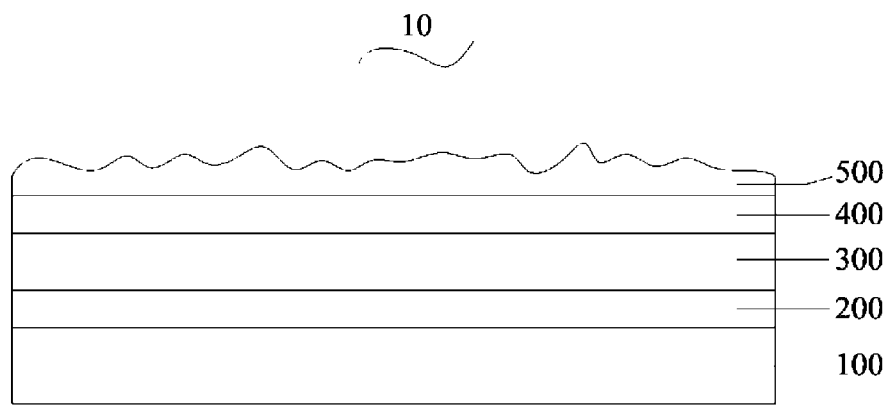
FIG. 1 is a structural schematic view illustrating an OLED provided by embodiments of the present disclosure.
Figure 2:
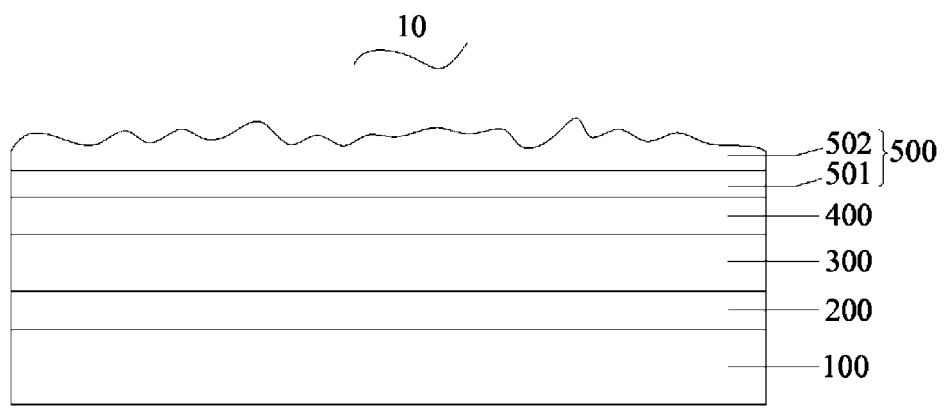
FIG. 2 is a structural schematic view illustrating the OLED provided by the embodiments of the present disclosure.
Figure 3:
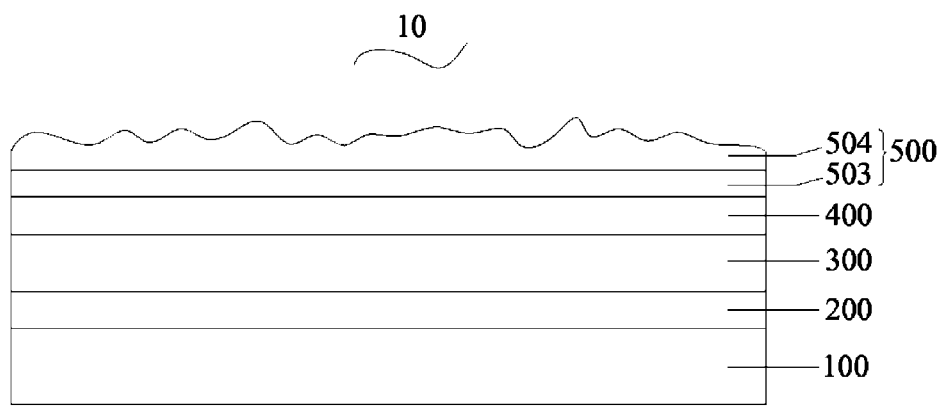
FIG. 3 is a structural schematic view illustrating the OLED provided by the embodiments of the present disclosure.

Embodiments of the present disclosure provide an OLED 10. As shown in FIG. 1 to FIG. 3, the OLED 10 comprises: a base substrate 100; a first electrode 200, an organic functional layer 300 and a transparent or semi-transparent second electrode 400 sequentially disposed on the base substrate; and a covering layer 500 provided on a side of the second electrode 400 away from the base substrate 100. A surface of the covering layer 500 away from the base substrate 100 is uneven.

The covering layer 500 is for example formed of a material of high transmittance, and the covering layer is for example of a single-layer structure or a multi-layer structure comprising two or more layers, which are selected according to practical requirements.

For example, the first electrode 200 is a cathode or an anode, and the second electrode 400 is the anode or the cathode. That is, if the first electrode 200 is the cathode, then the second electrode 400 is the anode; and if the first electrode 200 is the anode, then the second electrode 400 is the cathode.

For example, the organic functional layer 300 at least comprises a light-emitting layer. Furthermore, in order to improve an efficiency of injecting electrons and holes into the light-emitting layer, the organic functional layer 300 for example further comprises an electron transport layer, a hole transport layer, an electron injection layer disposed between the cathode and the electron transport layer, and a hole injection layer disposed between the hole transport layer and the anode.

In the case that an operating voltage is applied to the anode and the cathode, the holes in the anode and the electrons in the cathode are all injected into the light-emitting layer; the holes and the electrons meet in the light-emitting layer an recombine to form electron-hole pairs and release energy; the energy is emitted in the form of light, and the light emitted uniformly from both sides of the organic functional layer 300.

For example, the light emitted by the light-emitting layer is red light, green light, or blue light. Of course, the light emitted by the light-emitting layer may be white light.

The material for forming the first electrode 200 will not be limited in the embodiments of the present disclosure.

In the case that the first electrode 200 is formed of an opaque conductive material, the light emitted from the organic functional layer 300 is only exits from the second electrode 400; and in this case, the OLED is referred to as a top-emission type OLED. In the case that the first electrode 200 is formed of a transparent or semi-transparent conductive material, the light emitted from the organic functional layer 300 emits from the second electrode 400 or the first electrode 200; and in this case, the OLED is referred to as a double-side-emission type. For example, the opaque conductive material is relative thick silver (Ag), and the semi-transparent conductive material is relatively thin Ag.

In the embodiments of the present disclosure, since the covering layer 500 is provided on the second electrode 400 and the surface of the covering layer 500 away from the base substrate 100 is uneven, a refraction angle of the light emitted from the light-emitting layer in the organic functional layer 300 is changed when the light emitted from the light-emitting layer in the organic functional layer 300 is incident onto the covering layer 500, so that a total reflection phenomenon is reduced when the light exits to a glass substrate and/or the air. Thus, the light in waveguide-mode is reduced, and the light output efficiency is improved. Further, transmittance of the light can be adjusted by selecting a suitable material to form the covering layer 500.

For example, the first electrode 200 comprises a reflective opaque metal layer, and the second electrode 400 comprises a transflective semi-transparent metal layer. The opaque first electrode 200, the organic functional layer 300 and the semi-transparent second electrode 400 constitute a micro cavity, and the light output efficiency is further improved due to a light interference effect within the micro cavity (a micro-cavity effect).

For example, the covering layer 500 comprises a polycrystalline organic layer. In the case that a polycrystalline organic material is used to form a layer, a surface of the layer is uneven due to the inherent property of the polycrystalline organic layer.

Here, the covering layer 500 may only comprise the polycrystalline organic layer, or may comprise other layers than the polycrystalline organic layer, which will not be limited here.

Further, as shown in FIG. 2, the covering layer 500 comprises a first small-molecular organic layer 501 and a polycrystalline organic layer 502 provided on the first small-molecular organic layer, a refractive index difference between the first small-molecular organic layer 501 and the polycrystalline organic layer 502 is less than 0.1.

Here, the first small-molecular organic layer 501 is formed of a small-molecular organic material, such as TPTE (a formula of TPTE is:

TPPE (a formula of TPPE is:

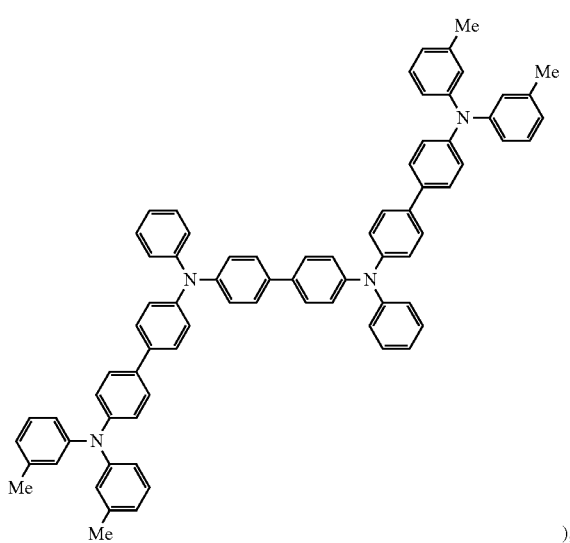 [SMILES: Cc1cccc(N(c2ccc(-c3ccc(N(c4ccccc4)c4ccc(-c5ccc(N(c6ccccc6)c6ccc(-c7ccc(N(c8cccc(C)c8)c8cccc(C)c8)cc7)cc6)cc5)cc4)cc3)cc2)c2cccc(C)c2)c1]

),

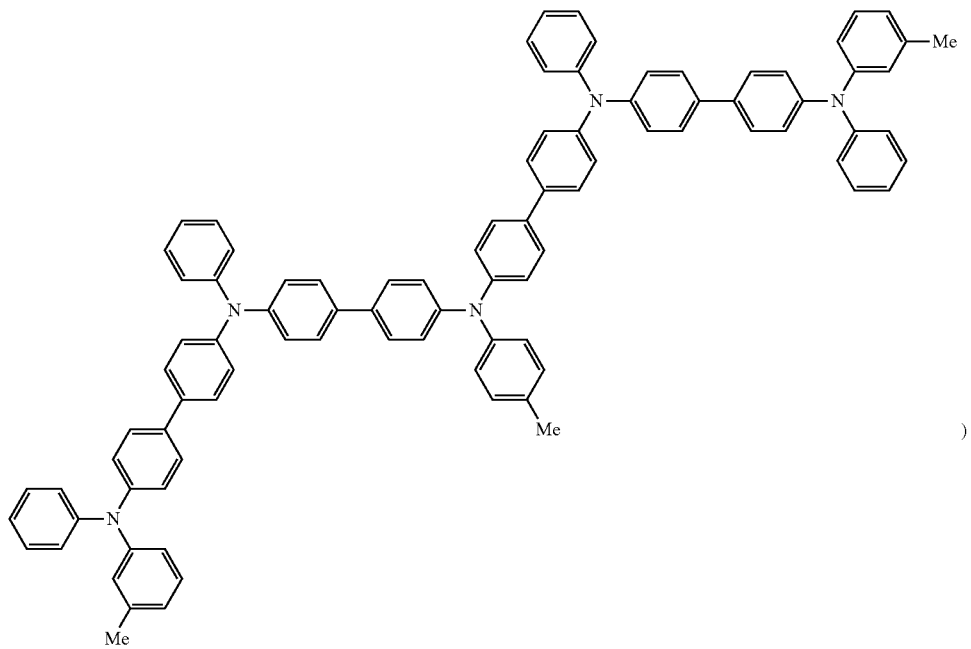 [SMILES: Cc1ccc(N(c2ccc(-c3ccc(N(c4ccccc4)c4ccc(-c5ccc(N(c6ccccc6)c6cccc(C)c6)cc5)cc4)cc3)cc2)c2ccc(-c3ccc(N(c4ccccc4)c4ccc(-c5ccc(N(c6ccccc6)c6cccc(C)c6)cc5)cc4)cc3)cc2)cc1]

), and the like.

The polycrystalline organic layer 502 is formed of the polycrystalline organic material, such as a polycrystalline organic material NET61 produced by Novaled.

Before forming the polycrystalline organic layer 502, the first small-molecular organic layer 501 is formed. In this way, in the case that the second electrode 400 is made of a thin metal layer, the damage to the second electrode 400, which is resulted from a crystal structure of the polycrystalline organic layer 502 penetrating into the second electrode 400 formed of the thin metal layer after crystallization of polycrystalline organic layer 502, is prevented. For example, the polycrystalline organic layer 502 and the first small-molecular organic layer 501 are formed by a evaporating method.

For example, the material of the first small-molecular organic layer 501 and the material of the polycrystalline organic layer 502 are selected to have approximate refractive indices, so that it can avoid such a case that a total reflection effect occurs on an interface between the first small-molecular organic layer 501 and the polycrystalline organic layer 502 when the light passes through the two layers and thus the light output efficiency is lowered.

It should be noted that, an inorganic layer may be used instead of the above-described first small-molecular organic layer 501; and in this case, the inorganic layer is formed by a sputtering method.

It should be noted that, the first small-molecular organic layer 501 may be of one layer or may be of two or more layers, and the polycrystalline organic layer 502 may be of one layer or may be of two or more layers, which will not be limited here. In addition, the covering layers 500 comprising the polycrystalline organic layer 502 are all within the scope of the present disclosure.

For example, as shown in FIG. 3, the covering layer 500 comprises a second small-molecular organic layer 503 and a third small-molecular organic layer 504 provided on the second small-molecular organic layer and having an uneven upper surface, and a refractive index difference between the second small-molecular organic layer 503 and the third small-molecular organic layer 504 is less than 0.1.

The uneven upper surface of the third small-molecular organic layer 504 is obtained by crystallizing a third small-molecular organic material for forming the third small-molecular organic layer; and a glass transition temperature of a second small-molecular organic material for forming the second small-molecular organic layer 503 is greater than a glass transition temperature of the third small-molecular organic material for forming the third small-molecular organic layer 504.

The glass transition temperature of the second small-molecular organic material for forming the second small-molecular organic layer 503 for example is greater than 120°

C.; and furthermore, the second small-molecular organic material for forming the second small-molecular organic layer for example is TPTE, TPPE and the like.

The glass transition temperature of the third small-molecular organic material for forming the third small-molecular organic layer 504 for example is 60~100° C.; and furthermore, the third small-molecular organic material for forming the third small-molecular organic layer 504 for example is:
NPB (a formula of NPB is:

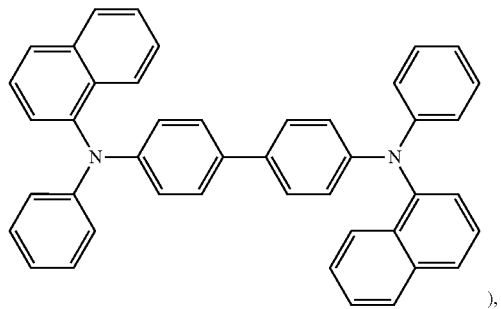 [SMILES: c1ccc(N(c2ccc(-c3ccc(N(c4ccccc4)c4cccc5ccccc45)cc3)cc2)c2cccc3ccccc23)cc1]

),

TPD (a formula of TPD is:

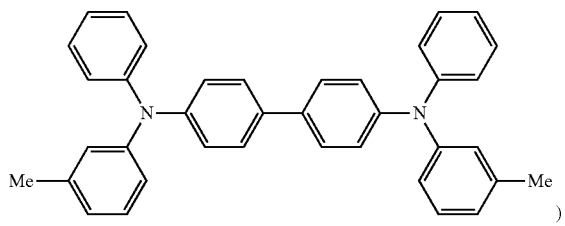 [SMILES: Cc1cccc(N(c2ccccc2)c2ccc(-c3ccc(N(c4ccccc4)c4cccc(C)c4)cc3)cc2)c1]

)

and the like.

It should be noted that, in a case that the surface of the second small-molecular organic layer 503 is flat, the surface of the third small-molecular organic layer 504, which is formed after the third small-molecular organic material is evaporated on the second small-molecular organic layer 503, originally is flat as well; and after the third small-molecular organic layer 504 is heated and the heating temperature reaches the glass transition temperature of the third small-molecular organic material, the surface of the third small-molecular organic layer 504 becomes uneven due to crystallization of the third small-molecular organic material.

It should be noted that, crystallization of the third small-molecular organic material for forming the third small-molecular organic layer 504 by heating only changes the third small-molecular organic material from an amorphous state into a polycrystalline state to a certain degree, and the third small-molecular organic material itself is not changed. Thus, the layer 504 is referred to as the third small-molecular organic layer 504 whether before or after the crystallization.

It should be noted that, the second small-molecular organic layer 503 may be of one layer or may be of two or more layers, and the third small-molecular organic layer 504 may be of one layer or may be of two or more layers, which will not be limited here.

On the one hand, the third small-molecular organic material is crystallized by heating the third small-molecular organic material for forming the third small-molecular organic layer 504 at a temperature slightly higher than the glass transition temperature of the third small-molecular organic material for forming the third small-molecular organic layer 504, so that the third small-molecular organic layer 504 has the uneven upper surface.

On the other hand, due to the presence of the second small-molecular organic layer 503, the damage to the second electrode 400 formed of a metal material below the third small-molecular organic layer 504 is avoided when the third small-molecular organic material for forming the third small-molecular organic layer 504 is crystallized.

Here, in order to avoid the damage to the second electrode 400 formed of the metal material below the third small-molecular organic layer 504 when the third small-molecular organic material for forming the third small-molecular organic layer 504 is crystallized, the glass transition temperature of the second small-molecular organic material for forming the second small-molecular organic layer 503 should be greater than the glass transition temperature of the third small-molecular organic material for forming the third small-molecular organic layer 504, and during a process of crystallizing the third small-molecular organic layer 504 by heating, it should be ensured that the heating temperature is less than the glass transition temperature of the second small-molecular organic material for forming the second small-molecular organic layer 503.

In addition, in order to avoid other adverse impacts on the OLED device during the crystallization process of the third small-molecular organic layer 504, packaging is performed at first after the third small-molecular organic layer 504 is formed, and then the third small-molecular organic material for forming the third small-molecular organic layer 504 is crystallized by heating.

Embodiments of the present disclosure further provide a display apparatus, and the display apparatus comprises the above-described OLED 10.

Here, the OLED is suitable for a passive-matrix type display apparatus or an active-matrix type display apparatus, which will not be limited here.

The display apparatus according to the embodiments of the disclosure comprises the above-described OLED 10. Since the covering layer 500 is provided on the second electrode 400 and the surface of the covering layer 500 away from the base substrate 100 is uneven, a refraction angle of the light emitted from the light-emitting layer in the organic functional layer 300 is changed when the light emitted from the light-emitting layer in the organic functional layer 300 is incident onto the covering layer 500, so that a total reflection phenomenon is reduced when the light exits to the glass substrate and/or the air. Thus, the light in waveguide-mode is reduced, and the light output efficiency is improved. Further, transmittance of the light can be adjusted by selecting a suitable material to form the covering layer 500.

Figure 4:
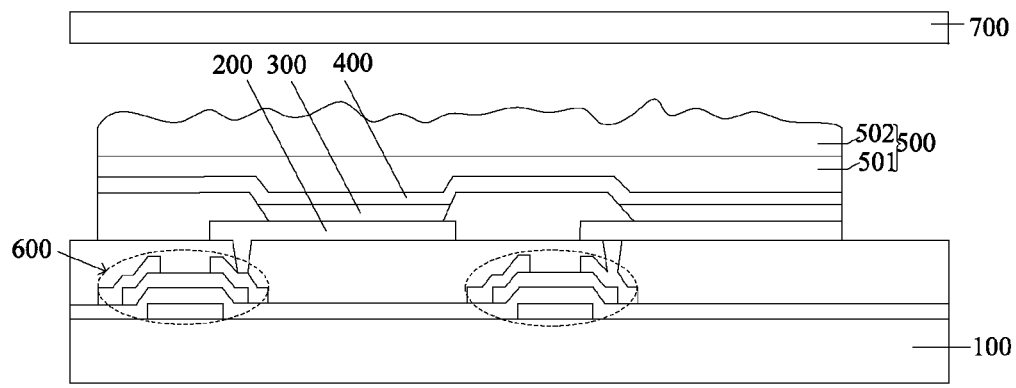
FIG. 4 is a structural schematic view illustrating an OLED display apparatus provided by the embodiments of the present disclosure.

In consideration that the passive matrix type display apparatus has some shortcomings when it is applied to a large-sized display apparatus, the display apparatus provided by the embodiments of the present disclosure preferably is the active-matrix display apparatus. That is, as shown in FIG. 4, the display apparatus further comprises a thin film transistor 600 disposed between the base substrate 100 and the first electrode 200 of the OLED.

The thin film transistor 600 comprises a gate electrode, a gate insulating layer, a semiconductor active layer, a source electrode and a drain electrode; and the drain electrode is connected with the first electrode 200 or the second electrode 400.

It should be noted that, the thin film transistor 600 may be of a top gate type or a bottom gate type, which will not be limited in the embodiments of the present disclosure.

Further, if the drain electrode is electrically connected with the second electrode 400, the second electrode 400 is necessarily to pass through the layer comprising the first electrode 200 and the layer comprising the organic functional layer 300 so as to be electrically connected with the drain electrode; and in this case, a short circuit may be caused between the second electrode 400 and the first electrode 200 and a fabrication process is relatively complex due to particularity of the material for forming the organic functional layer 300. Based on this, in the embodiments of the present disclosure, preferably the drain electrode of the thin film transistor 600 is electrically connected with the first electrode 200.

Here, if the first electrode 200 is used as the anode, then a voltage of the second electrode 50 used as the cathode is constant; and if the first electrode 200 is used as the cathode, then the voltage of the second electrode 50 used as the anode is constant.

In addition, as shown in FIG. 4, the OLED display apparatus for example further comprises a packaging substrate 700 covering the covering layer 500.

Embodiments of the present disclosure further provide a fabrication method of an OLED. With reference to FIG. 1, the method comprises: sequentially forming a first electrode 200, an organic functional layer 300, and a transparent or semi-transparent second electrode 400 on a base substrate 100, and forming a covering layer 500 provided on a side of the second electrode 400 away from the base substrate 100. A surface of the covering layer 500 away from the base substrate 100 is uneven.

Since the covering layer 500 is provided on the second electrode 400 and the surface of the covering layer 500 away from the base substrate 100 is uneven, a refraction angle of the light emitted from the light-emitting layer in the organic functional layer 300 is changed when the light emitted from the light-emitting layer in the organic functional layer 300 is incident onto the covering layer 500, so that a total reflection phenomenon is reduced when the light exits to a glass substrate and/or the air. Thus, the light in waveguide-mode is reduced, and the light output efficiency is improved. Further, transmittance of the light can be adjusted by selecting a suitable material to form the covering layer 500.

For example, the first electrode 200 comprises a reflective opaque metal layer, and the second electrode 400 comprises a transflective semi-transparent metal layer. The opaque first electrode 200, the organic functional layer 300 and the semi-transparent second electrode 400 constitute a micro cavity, and the light output efficiency is further improved due to a light interference effect within the micro cavity (a micro-cavity effect).

For example, the covering layer 500 is formed by the following modes.

Mode One: In the case that a polycrystalline organic material is used to form a layer, a surface of the layer is uneven due to the inherent property of the polycrystalline organic layer. Thus, a polycrystalline organic layer 502 is used as the covering layer 500.

In the Mode One, the polycrystalline organic layer 502 is formed for example by an evaporating method on the substrate provided with the second electrode 400 to use as the covering layer.

For example, with reference to FIG. 2, the forming the covering layer 500 comprises: sequentially forming a first small-molecular organic layer 501 and the polycrystalline organic layer 502 for example by the evaporating method on the substrate provided with the second electrode 400 in a vacuum cavity. For example, the refractive index difference between the first small-molecular organic layer 501 and the polycrystalline organic layer 502 is less than 0.1.

For example, the first small-molecular organic layer 501 is formed of a small-molecular organic material, such as TPTE, TPPE and the like. For example, the polycrystalline organic layer 502 is formed of the polycrystalline organic material, such as a polycrystalline organic material NET61 produced by Novaled.

Figure 5:
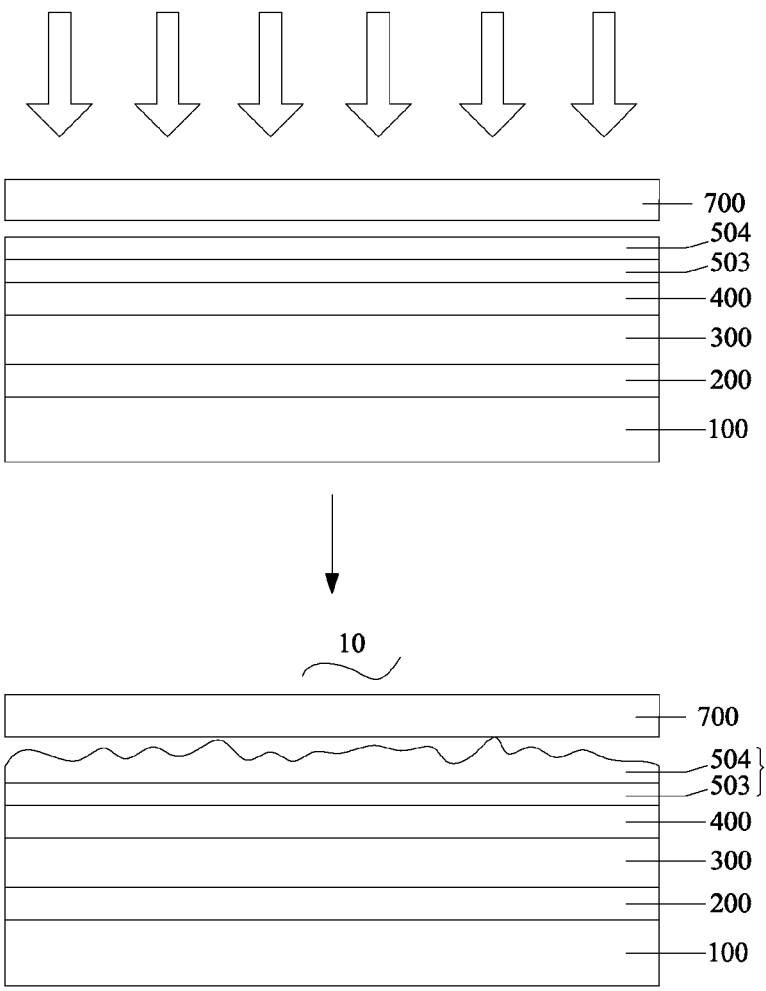
FIG. 5 is a schematic view illustrating a fabrication method of an OLED provided by the embodiments of the present disclosure.

Mode Two: with reference to FIG. 5, a second small-molecular organic layer 503 and a third small-molecular organic layer 504 are sequentially formed for example by the evaporating method on the substrate provided with the second electrode 400 in a vacuum cavity. For example, a glass transition temperature of a second small-molecular organic material for forming the second small-molecular organic layer 503 is greater than a glass transition temperature of a third small-molecular organic material for forming the third small-molecular organic layer 504.

In the Mode Two, the above-described OLED is packaged after the third small-molecular organic layer 504 is formed, and then the third small-molecular organic layer 504 is heated with a temperature slightly higher than the glass transition temperature of the third small-molecular organic material, so as to crystallize the third small-molecular organic material for forming the third small-molecular organic layer 504.

The glass transition temperature of the second small-molecular organic material for forming the second small-molecular organic layer 503 for example is greater than 120° C.; and furthermore, the second small-molecular organic material for forming the second small-molecular organic layer for example is TPTE, TPPE and the like.

The glass transition temperature of the third small-molecular organic material for forming the third small-molecular organic layer 504 for example is 60~100° C.; and furthermore, the third small-molecular organic material for forming the third small-molecular organic layer 504 for example is NPB, TPD and the like.

Here, in order to avoid the damage to the second electrode 400 formed of the metal material below the third small-molecular organic layer 504 when the third small-molecular organic material for forming the third small-molecular organic layer 504 is crystallized, the glass transition temperature of the second small-molecular organic material for forming the second small-molecular organic layer 503 should be greater than the glass transition temperature of the third small-molecular organic material for forming the third small-molecular organic layer 504, and during a process of crystallizing the third small-molecular organic layer 504 by heating, it should be ensured that the heating temperature is less than the glass transition temperature of the second small-molecular organic material for forming the second small-molecular organic layer 503.

In addition, in order to avoid other adverse impacts on the OLED device during the crystallization process of the third small-molecular organic layer 504, packaging is performed at first after the third small-molecular organic layer 504 is formed, and then the third small-molecular organic material for forming the third small-molecular organic layer 504 is crystallized by heating.

Embodiments of the present disclosure further provide a fabrication method of an OLED display apparatus. With reference to FIG. 4, the method comprises: sequentially forming a thin film transistor 600, a first electrode 200, an organic functional layer 300, a transparent or semi-transparent second electrode 400 on a base substrate 100, and forming a covering layer 500 provided on a side of the second electrode 400 away from the base substrate 100. A surface of the covering layer 500 away from the base substrate 100 is uneven.

The thin film transistor 600 comprises a gate electrode, a gate insulating layer, a semiconductor active layer, a source electrode and a drain electrode. The thin film transistor 600 may be of a bottom gate type or a top gate type. The drain electrode is connected with the first electrode 200 or the second electrode 400.

For example, the drain electrode of the thin film transistor 600 is electrically connected with the first electrode 200. Thus, the fabrication process can be simplified since the first electrode 200 is close to the thin film transistor 600.

In addition, as shown in FIG. 4, the method further comprises: forming a packaging substrate 700 covering the covering layer 500.

For example, the covering layer 500 is formed by the following modes.

Mode One: the polycrystalline organic layer 502 is formed for example by an evaporating method on the substrate provided with the second electrode 400 to use as the covering layer.

For example, with reference to FIG. 2, the forming the covering layer 500 comprises: sequentially forming a first small-molecular organic layer 501 and the polycrystalline organic layer 502 for example by the evaporating method on the substrate provided with the second electrode 400 in a vacuum cavity. For example, the refractive index difference between the first small-molecular organic layer 501 and the polycrystalline organic layer 502 is less than 0.1.

Mode Two: with reference to FIG. 5, a second small-molecular organic layer 503 and a third small-molecular organic layer 504 are sequentially formed for example by the evaporating method on the substrate provided with the second electrode 400 in a vacuum cavity. For example, a glass transition temperature of a second small-molecular organic material for forming the second small-molecular organic layer 503 is greater than a glass transition temperature of a third small-molecular organic material for forming the third small-molecular organic layer 504.

In the Mode Two, the above-described apparatus is packaged after the third small-molecular organic layer 504 is formed, and then the third small-molecular organic layer 504 is heated with a temperature slightly higher than the glass transition temperature of the third small-molecular organic material, so as to crystallize the third small-molecular organic material for forming the third small-molecular organic layer 504.

It should be noted that, in the embodiments of the present disclosure, the above-described covering layer 500 may be replaced by a micro-lens array film or a prism film formed of polyimide (PI) attached on the second electrode 400, which will not be repeated here.

The foregoing embodiments merely are exemplary embodiments of the disclosure, and not intended to define the scope of the disclosure, and the scope of the disclosure is determined by the appended claims.

The present application claims priority of Chinese Patent Application No. 201410191903.2 filed on May 8, 2014, the disclosure of which is incorporated herein by reference in its entirety as part of the present application.

What is claimed is:

1. An OLED, comprising:
a base substrate;
a first electrode, an organic functional layer and a transparent or semi-transparent second electrode sequentially disposed on the base substrate; and
a covering layer provided on a side of the second electrode away from the base substrate,
wherein a surface of the covering layer away from the base substrate is an outermost surface of the OLED and is uneven, and
wherein the covering layer further has one of following two structures:
the covering layer comprises a first small-molecular organic layer and a polycrystalline organic layer provided on the first small-molecular organic layer, the polycrystalline organic layer is different from the first small-molecular organic layer, the surface of the covering layer away from the base substrate is uneven due to an inherent property of the polycrystalline organic layer, and a refractive index difference between the first small-molecular organic layer and the polycrystalline organic layer is less than 0.1, and
the covering layer comprises a second small-molecular organic layer and a third small-molecular organic layer provided on the second small-molecular organic layer and having an uneven upper surface, the third small-molecular organic layer is different from the second small-molecular organic layer, a refractive index difference between the second small-molecular organic layer and the third small-molecular organic layer is less than 0.1, and a glass transition temperature of a second small-molecular organic material for forming the second small-molecular organic layer is greater than a glass transition temperature of a third small-molecular organic material for forming the third small-molecular organic layer.

2. The OLED according to claim 1, wherein the first electrode comprises an opaque metal layer, and the second electrode comprises a semi-transparent metal layer.

3. A display apparatus, comprising an OLED according to claim 1.

4. The display apparatus according to claim 3, further comprising a thin film transistor disposed between the base substrate and the first electrode of the OLED.

5. The display apparatus according to claim 4, wherein the first electrode of the OLED is electrically connected with a drain electrode of the thin film transistor.

6. A fabrication method of an OLED, comprising:
sequentially forming a first electrode, an organic functional layer, a transparent or semi-transparent second electrode on a base substrate; and
forming a covering layer provided on a side of the second electrode away from the base substrate,
wherein a surface of the covering layer away from the base substrate is an outermost surface of the OLED and is uneven, and
wherein the forming the covering layer further comprises one of following two steps:
sequentially forming a first small-molecular organic layer and a polycrystalline organic layer on the base substrate provided with the second electrode, wherein the polycrystalline organic layer is different from the first small-molecular organic layer, the surface of the covering layer away from the base substrate is uneven due to an inherent property of the polycrystalline organic layer, and a refractive index difference between the first small-molecular organic layer and the polycrystalline organic layer being less than 0.1, and sequentially forming a second small-molecular organic layer and a third small-molecular organic layer on the base substrate provided with the second electrode, and crystallizing a third small-molecular organic material for forming the third small-molecular organic layer so that the third small-molecular organic layer has an uneven upper surface, wherein the third small-molecular organic layer is different from the second small-molecular organic layer, a refractive index difference between the second small-molecular organic layer and the third small-molecular organic layer is less than 0.1, and a glass transition temperature of a second small-molecular organic material for forming the second small-molecular organic layer is greater than a glass transition temperature of the third small-molecular organic material for forming the third small-molecular organic layer.

7. The method according to claim 6, wherein the forming the covering layer comprises:

sequentially forming the second small-molecular organic layer and the third small-molecular organic layer on the base substrate provided with the second electrode;

packaging the OLED; and heating the third small-molecular organic layer after the packaging with a temperature slightly higher than the glass transition temperature of the third small-molecular organic material, so as to crystallize the third small-molecular organic material for forming the third small-molecular organic layer.

8. The method according to claim 7, wherein the glass transition temperature of the second small-molecular organic material is greater than 120° C.; and the glass transition temperature of the third small-molecular organic material is 60~100° C.

9. The method according to claim 6, wherein the first electrode comprises an opaque metal layer, and the second electrode comprises a semi-transparent metal layer.

10. A fabrication method of an OLED, comprising:

sequentially forming a first electrode, an organic functional layer, a transparent or semi-transparent second electrode on a base substrate; and forming a covering layer provided on a side of the second electrode away from the base substrate, wherein a surface of the covering layer away from the base substrate is uneven, and wherein the forming the covering layer comprises:

sequentially forming a second small-molecular organic layer and a third small-molecular organic layer on the base substrate provided with the second electrode, wherein a glass transition temperature of a second small-molecular organic material for forming the second small-molecular organic layer is greater than a glass transition temperature of a third small-molecular organic material for forming the third small-molecular organic layer;

packaging the OLED; and heating the third small-molecular organic layer after packaging with a temperature slightly higher than the glass transition temperature of the third small-molecular organic material, so as to crystallize the third small-molecular organic material for forming the third small-molecular organic layer.

11. The method according to claim 10, wherein the glass transition temperature of the second small-molecular organic material is greater than 120° C.; and the glass transition temperature of the third small-molecular organic material is 60~100° C.

* * * * *